United States Patent
Stave

[11] Patent Number: 6,166,576
[45] Date of Patent: Dec. 26, 2000

[54] METHOD AND APPARATUS FOR CONTROLLING TIMING OF DIGITAL COMPONENTS

[75] Inventor: Eric J. Stave, Meridian, Id.

[73] Assignee: Micron Technology, Inc., Boise, Id.

[21] Appl. No.: 09/145,744

[22] Filed: Sep. 2, 1998

[51] Int. Cl.[7] .................................................. H03H 11/26
[52] U.S. Cl. .......................... 327/266; 327/270; 327/276; 327/149; 327/153
[58] Field of Search ...................................... 327/261, 266, 327/270, 269, 271, 276–278, 280, 281, 284, 287, 288, 146, 149, 153, 155, 158, 283, 277; 326/30

[56] References Cited

U.S. PATENT DOCUMENTS

| | | | |
|---|---|---|---|
| 3,528,016 | 9/1970 | Koontz | 327/283 |
| 5,297,179 | 3/1994 | Tatsumi | 377/47 |
| 5,355,038 | 10/1994 | Hui | 327/277 |
| 5,515,291 | 5/1996 | Omori et al. | 364/488 |
| 5,781,055 | 7/1999 | Bhagwan | 327/270 |

*Primary Examiner*—Terry D. Cunningham
*Assistant Examiner*—Quan Tra
*Attorney, Agent, or Firm*—Williams, Morgan & Amerson, P.C.

[57] ABSTRACT

The present invention provides a method for controlling a timing of a digital component having an impedance-input terminal. The method includes determining an impedance level present at the impedance-input terminal, and delaying the timing of the digital component based on the impedance level. The present invention also provides a digital component and a system, where the digital component includes an impedance-input terminal and an impedance matching circuit that is capable of determining an impedance level present at the impedance-input terminal. The digital component also includes a delay circuit that is capable of delaying a timing of the digital component based on the impedance level.

30 Claims, 5 Drawing Sheets

METHOD AND APPARATUS FOR CONTROLLING TIMING OF DIGITAL COMPONENTS

BACKGROUND OF THE INVENTION

1. Field of the Invention

This invention relates generally to digital components, and, more particularly, to controlling timing of the digital components.

2. Description of the Related Art

The demand for quicker and more powerful computers and other such devices has led to many technological advances in the electronic industry, including the development of faster digital components, such as memories, processors, controllers, or the like. While the performance of these digital components has improved markedly in the aggregate, the technological advancements at the individual component level have varied from one digital component to another. That is, it is possible that controllers may not have kept pace with today's faster memories, such as, for example, dynamic random access memories (DRAMs) or static random access memories (SRAMs). Because the technological advancement rate varies for each component, designers are constantly confronted with the challenge of integrating faster components with slower components in a single electrical device, such as a computer.

The integration of faster components with slower ones, however, can result in several problems. For example, a computer having a faster SRAM integrated with slower digital components may have bus contention, as well as other synchronization, problems. A bus contention may occur when the faster SRAM attempts to drive the bus at the same time as one of the slower components. That is, because the SRAM operates at a faster clock speed, it starts driving the bus before the slower component completely stops driving.

One prior art method of integrating faster components with slower ones includes providing an external switch that controls the speed of the faster digital component. This method, however, suffers from at least one shortcoming in that it offers only two speeds, either high or low. Thus, the end user wishing to operate the faster component at a speed somewhere between the high or low speed would not be able to do so using the methods currently known to the art. The prior art method suffers from another shortcoming in that the access time, high-impedance time, low-impedance time, hold time, or output time of the faster component cannot be readily adjusted. Because the aforementioned times are well known to those skilled in the art, they will not be described herein.

The present invention is directed to overcoming, or at least reducing the effects of, one or more of the problems set forth above.

SUMMARY OF THE INVENTION

In one aspect of the present invention, a method is provided for controlling a timing of a digital component having an impedance-input terminal. The method includes determining an impedance level present at the impedance-input terminal, and delaying the timing of the digital component based on the impedance level.

In another aspect of the instant invention, a digital component is provided that includes an impedance-input terminal and an impedance matching circuit that is capable of determining an impedance level present at the impedance-input terminal. The digital component comprises a delay circuit that is capable of delaying a timing of the digital component based on the impedance level.

In another aspect of the instant invention, a system is provided that includes an impedance adjuster and a digital component. The impedance adjuster comprises an impedance adjuster having a control input terminal and an output terminal, where the control input terminal of the impedance adjuster is capable of adjusting an impedance level to a preselected level. The digital component includes an impedance-input terminal that is coupled to the output terminal of the impedance adjuster. The digital component comprises a means for determining an impedance level present at the impedance-input terminal, and a means for delaying a timing of the digital component based on the impedance level.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
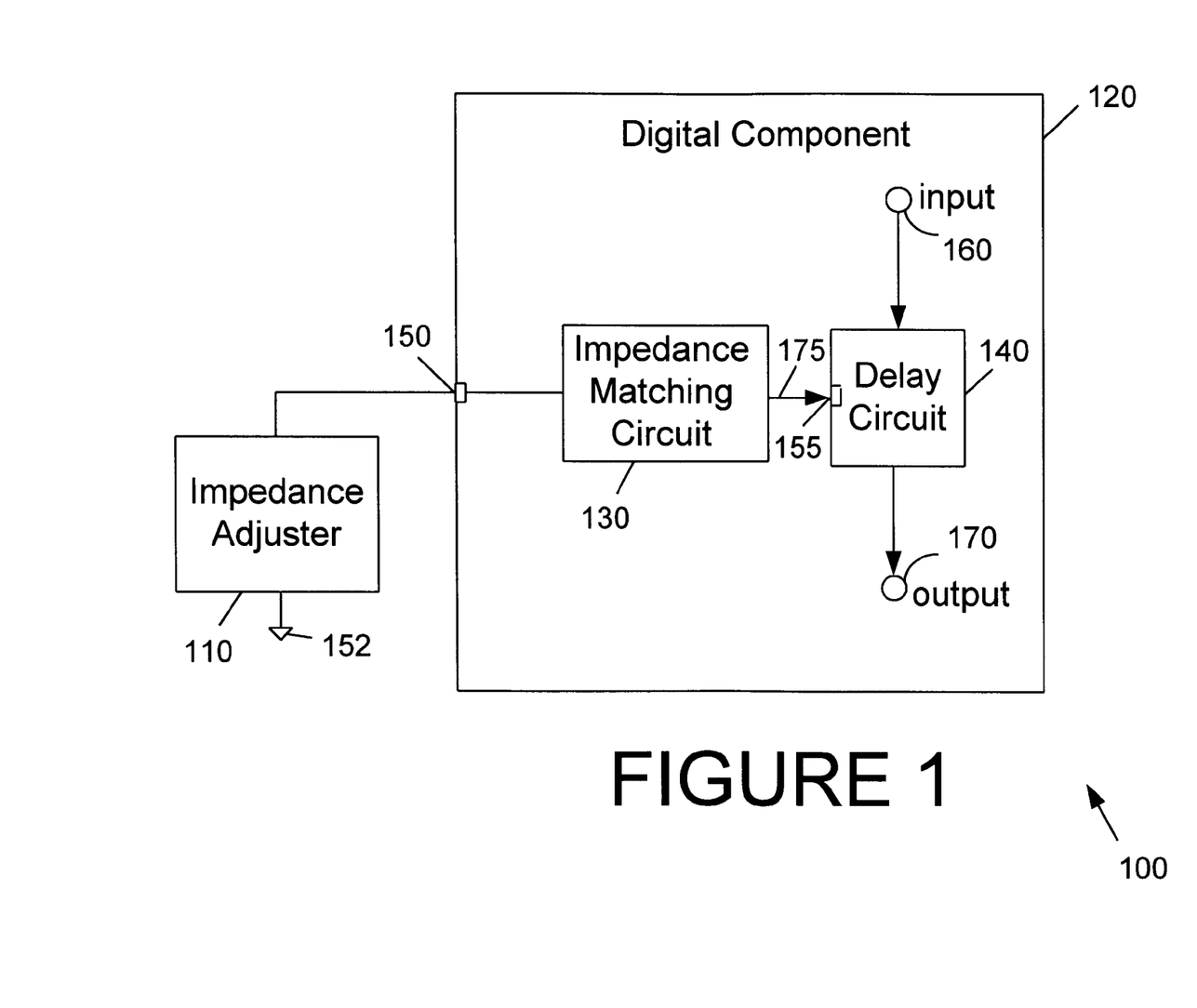
FIG. 1 is a block diagram of a system in accordance with the present invention.

Referring now to the drawings, and in particular to FIG. 1, an embodiment of a system 100 in accordance with the present invention is shown. The system 100 includes an impedance adjuster 110 and a digital component 120 that comprises an impedance matching circuit 130 coupled to a delay circuit 140. The digital component 120 may be any of a variety of electrical devices including, but not limited to, a microprocessor, a controller, a memory, or an integrated circuit. It should be noted that while the impedance matching circuit 130 is illustrated as internal to the digital component 120, in another embodiment it may be external to the digital component 120.

An output terminal of the impedance adjuster 110 is coupled to an impedance-input terminal 150 of the digital component 120, and an input terminal of the impedance adjuster 110 is coupled to a ground node 152. In one embodiment, the impedance-input terminal 150 may comprise a single, external pin. The impedance adjuster 110 can be a device capable of allowing an end user to set an impedance level of the impedance adjuster 110 to a desired value. In one embodiment, the impedance adjuster 110 may comprise a resistor, or a combination of resistors. In other embodiments, the impedance adjuster 110 may be a variable resistor or any other electrical device, or a combination thereof, that is capable of providing an impedance level desired by an end user.

Figure 2:
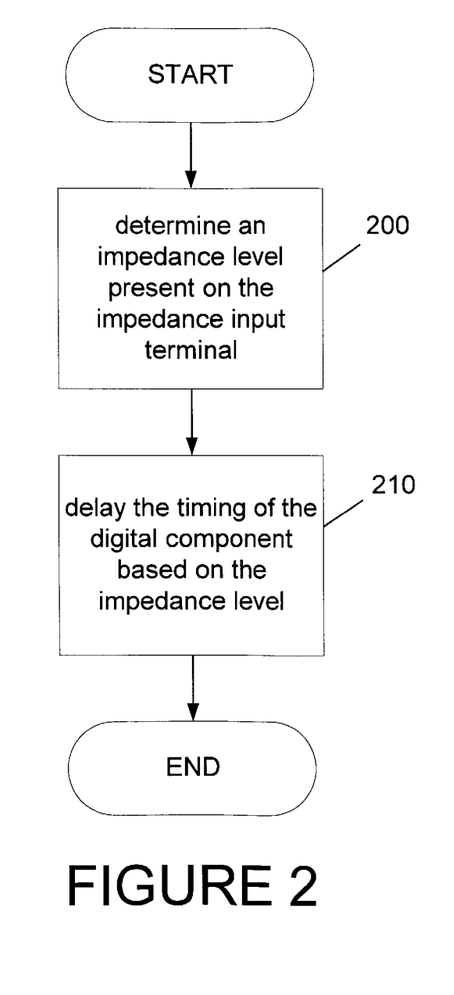
FIG. 2 illustrates one embodiment of a method in accordance with the present invention that can be employed by the system of FIG. 1.

FIG. 2 illustrates a method in accordance with the present invention that can be implemented using the system 100 of FIG. 1. Using the method of FIG. 2, it is possible to control the access time, hold time, high-impedance time, low-impedance time, or output time of the digital component 120. Controlling one or more of the aforementioned times allows the end user to readily integrate the digital component 120 in a system (not shown) that may have slower components (not shown).

With reference to FIG. 2, the impedance matching circuit 130 (see FIG. 1), at block 200, determines the impedance level present at the impedance-input terminal 150. As mentioned above, the end user can utilize the impedance adjuster 110 to define the impedance level. At block 210, the delay circuit 140 delays the timing of the digital component 120 based on the impedance level determined by the impedance matching circuit 130. The orientation of the delay circuit 140 determines which time or times (i.e., access, hold, etc.) of the digital component 120 are delayed, as is described in more detail below in FIG. 5.

The delay circuit 140 of FIG. 1 includes a control terminal 155, an input terminal 160, and an output terminal 170. A control signal on a line 175 is provided by the impedance matching circuit 130 to the control terminal 155 of the delay circuit 140. The delay circuit 140, in response to the control signal on the line 175, is capable of delaying a signal received from the input terminal 160 by a selected interval before it arrives at the output terminal 170. In the illustrated embodiment, the delay circuit 140 provides a variable or programmable delay, where the amount of the delay provided by the delay circuit 140 is determined by the control signal provided by the impedance matching circuit 130 on the line 175.

Figure 3:
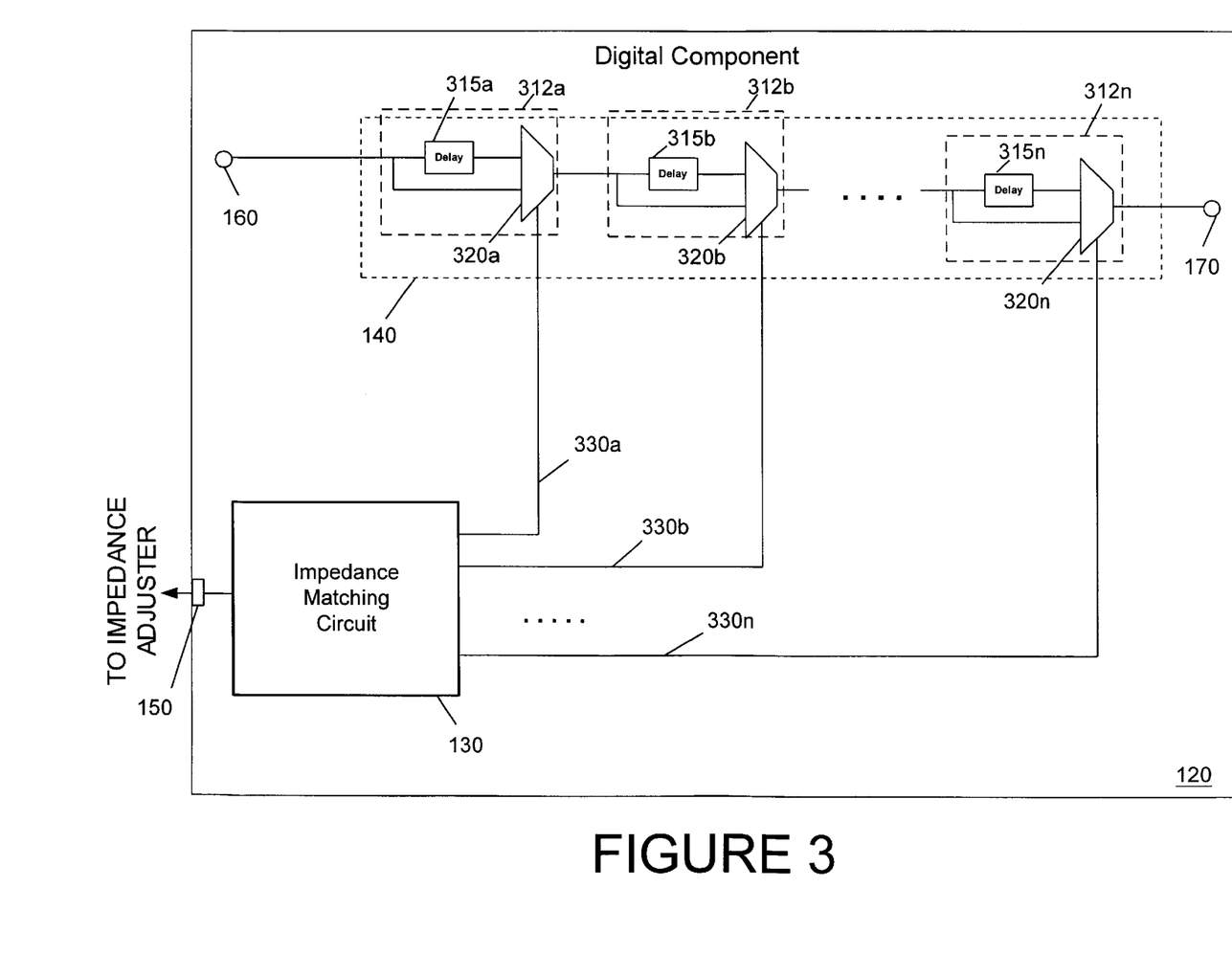
FIG. 3 illustrates one embodiment of a delay circuit that can be employed by the system of FIG. 1.

FIG. 3 illustrates one embodiment of the delay circuit 140 and the impedance matching circuit 130 that can be implemented in the digital component 120 shown in FIG. 1. The delay circuit 140 includes the input and output terminals 160, 170, and a plurality of delay cells 312(a–n), where n as used herein is equal to more than one. It should be noted that although the illustrated embodiment employs n delay cells 312(a–n), in another embodiment it may be possible to utilize a single delay cell.

The delay cells 312(a–n) comprise a plurality of delay elements 315(a–n) and multiplexers 320(a–n), where each delay element 315(a–n) has a corresponding multiplexer 320(a–n). The delay elements 315(a–n) may in one embodiment comprise one or more inverters (not shown) capable of delaying an incoming signal. For clarity and ease of illustration, only the first, second, and last delay cells 312a, 312b, 312n are shown. The intermediate delay cells 312(c to n–1) have been omitted to avoid obscuring the invention. The delay cells 312(a–n) are coupled in a serial manner, as shown in FIG. 3. Those skilled in the art will appreciate that in alternative embodiments the delay cells 312(a–n) may be interconnected in a variety of configurations.

The multiplexers 320(a–n) of the delay cells 312(a–n) include a first and second input terminal and a control input terminal. The input terminal 160 of the delay circuit 140 is coupled to an input terminal of the first delay element 315a, as well as to a first input terminal of the first multiplexer 320a. An output terminal of the first delay element 315a is coupled to the second input terminal of the first multiplexer 320a. An output terminal of the first multiplexer 320a is coupled to an input terminal of the second delay element 315b, as well as to a first input terminal of the second multiplexer 320b. The intermediate delay elements 315(c to n–1) are connected to the respective multiplexers 320(c to n–1) in a like manner until the last delay element 315n and multiplexer 320n. An output terminal of the last multiplexer 320n comprises the output terminal 170 of the delay circuit 140.

The control signal on the line 175 (see FIG. 1) provided by the impedance matching circuit 130 comprises a plurality of control signals on lines 330(a–n) in the illustrated embodiment. The control signals on the lines 330(a–n) are coupled to the control input terminals of the respective multiplexers 320(a–n) of the respective delay cells 312(a–n). The delay circuit 140 is capable of providing a variable delay in response to the control signals on the lines 330(a–n).

The impedance matching circuit 130 provides the control signals to the control input terminals of the multiplexers 320(a–n) on the lines 330(a–n) to enable or disable the delay cells 312(a–n). That is, the multiplexers 320(a–n) will either allow a non-delayed signal from the first input terminal or a delayed signal from the second input terminal to pass through, depending on the control signals provided to the control input terminals of the multiplexers 320(a–n) on the lines 330(a–n). For example, if the impedance matching circuit 130 provides only a first and second control signal on the lines 330a, 330b, then only the first and second delay cells 312a, 312b will delay an incoming signal from the input terminal of the delay circuit 140. Because no control signals are provided on the lines 330(c–n), the delay cells 312(c–n) will remain inactive and will not delay the incoming signal. Thus, the impedance matching circuit 130, by activating or deactivating the delay cells 312(a–n) of the delay circuit 140, delays the incoming signal at the input terminal 160 by a selected interval based on the control signals on the lines 330(a–n). The number of control signals provided by the impedance matching circuit 130 on the lines 330(a–n) depends on the impedance level present at the impedance-input terminal 150 of the digital component 120, a process described in more detail below.

Figure 4:
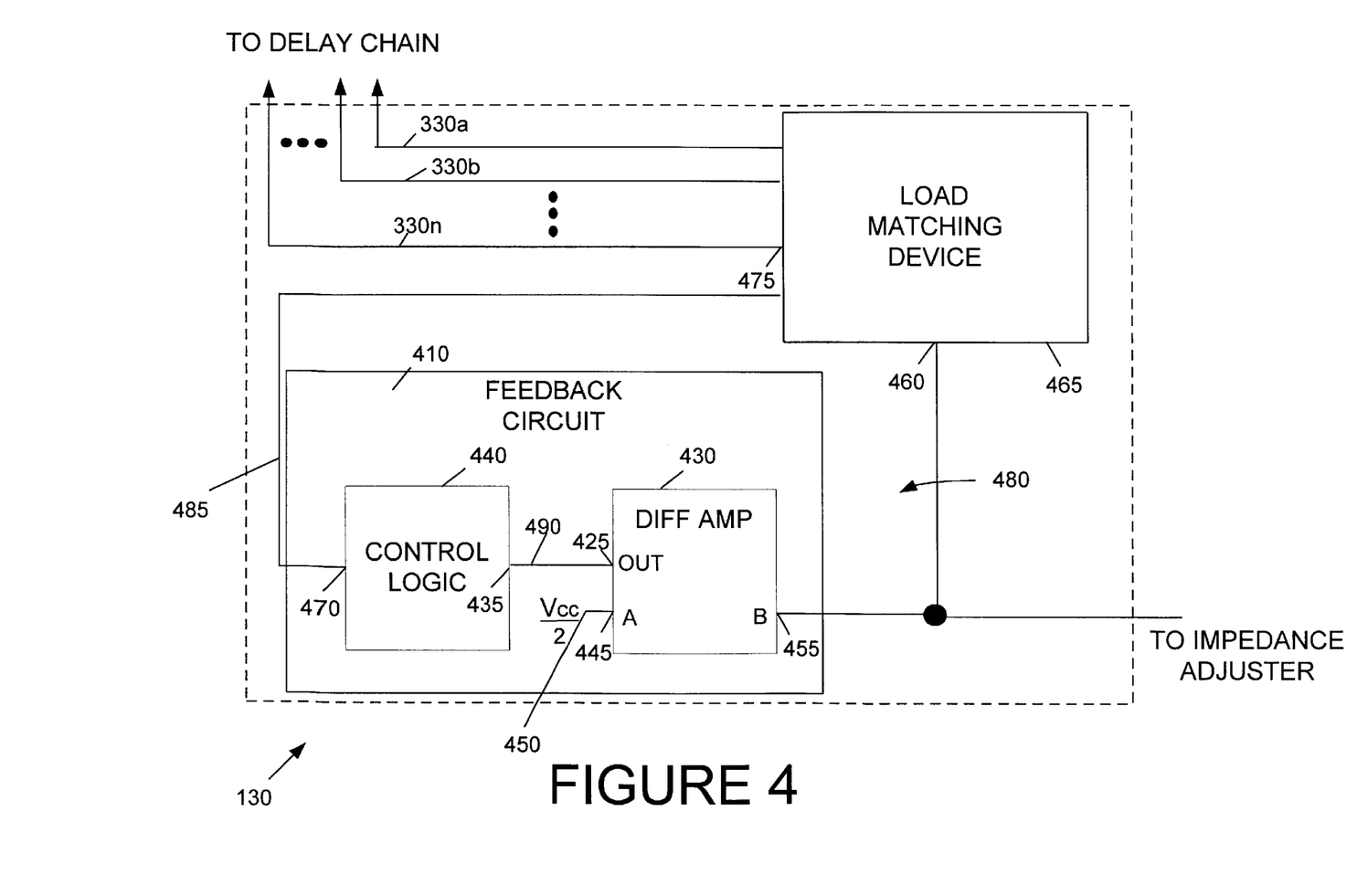
FIG. 4 illustrates one embodiment of an impedance matching circuit that can be employed by the system of FIG. 1.

FIG. 4 illustrates one embodiment of the impedance matching circuit 130 that can be employed with the delay circuit 140 of FIG. 3. The impedance matching circuit 130 includes a feedback circuit 410 having an output terminal 425 of a differential amplifier 430 coupled to an input terminal 435 of a control logic 440. A first terminal ("A"— also referred to as a reference terminal) 445 of the differential amplifier 430 is coupled to a voltage source terminal 450 having a voltage of $V_{cc}/2$. A second terminal ("B") 455 of the differential amplifier 430 is coupled to the impedance-input terminal 150 (see FIGS. 1 and 3) of the digital component 120 (see FIGS. 1 and 3), as well as to a first terminal 460 of a load matching device 465. An output terminal 470 of the control logic 440 of the feedback circuit 410 is coupled to a second terminal 475 of the load matching device 465. The feedback circuit 410 and the load matching device 465 form a feedback loop 480.

The feedback circuit 410 is capable of activating and/or deactivating the load matching device 465, which, in turn, controls the multiplexers 320(a–n) of the delay circuit 140 of FIG. 3. The load matching device 465 of the impedance matching circuit 130 in the illustrated embodiment is a pull-up load matching device comprising a plurality of p-channel devices (not shown), such as transistors, that either turn "on" or "off," depending on an output signal on line 485 from the control logic 440. The plurality of p-channel devices (not shown) provide control signals on the lines 330(a–n) that are coupled to control input terminals of the multiplexers 320(a–n) (see FIG. 3) of the delay circuit 140. Those skilled in the art will appreciate that in an alternative embodiment, the load matching device 465 may comprise a plurality of n-channel devices.

The number of p-channel devices (not shown) activated by the feedback circuit 410 varies according to the impedance level present at impedance-input terminal 150 (see FIGS. 1 and 3) of the digital component 120. The differential amplifier 430 determines the voltage difference between the first terminal 445 (i.e., which is set $V_{cc}/2$) and the second terminal 455. The differential amplifier 430 provides an output signal on line 490 that is proportional to the voltage difference between the two terminals 445, 455 to the input terminal 435 of the control logic 440. The control logic 440, through the feedback loop 480, provides a signal on the line 485 to the second terminal 475 of the load matching device 465 that either turns "on" or "off" one or more of the p-channel devices (not shown) to achieve a voltage level of substantially $V_{cc}/2$ at the second terminal 455 of the differential amplifier 430.

In one embodiment, the load matching device 465 may be a pull-down load device, which can be utilized to determine the impedance level present at the impedance-input terminal 150. The pull-down load device may comprise a plurality of n-channel or p-channel devices (not shown) that are activated or deactivated to achieve a voltage level of substantially $V_{cc}/2$ at the second terminal 455 of the differential amplifier 430. Generally, a voltage source (not shown) is coupled between the impedance adjuster 110 (see FIG. 1) and the ground node 152 (see FIG. 1) when the load matching device 465 is a pull-down load device.

Those skilled in the art will appreciate that a variety of impedance matching circuits 130 may be utilized in accordance with the present invention to determine the impedance level set by the impedance adjuster 110 (see FIG. 1). An example of a means for determining an impedance level of a resistor is illustrated in U.S. Pat. No. 5,606,275, which is incorporated herein by reference in its entirety.

Figure 5:
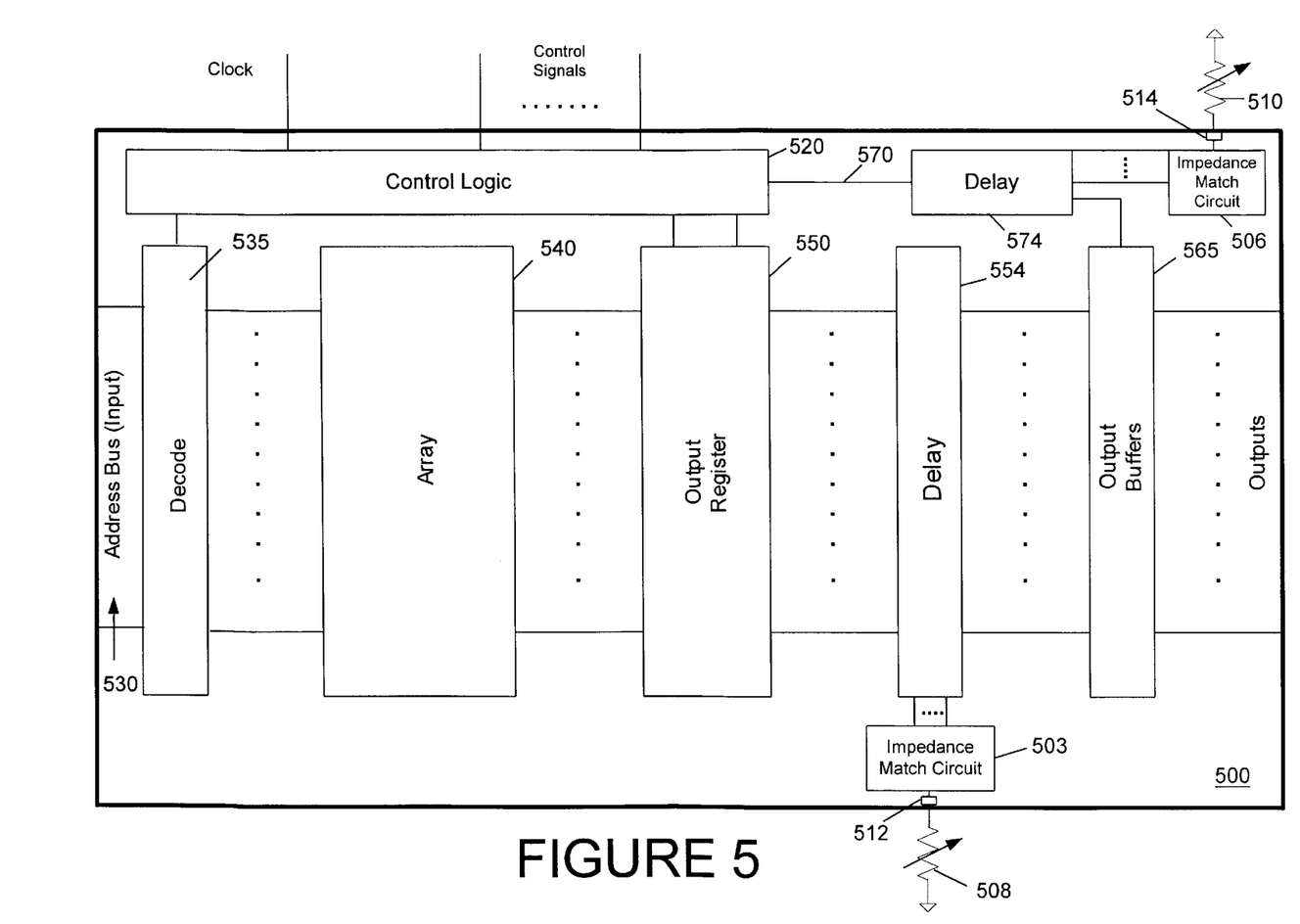
FIG. 5 is a block diagram of an SRAM in accordance with the present invention that can employ the method of FIG. 2.

FIG. 5 illustrates one embodiment of a digital component 120 in accordance with the present invention. Specifically, although not so limited, the digital component 120 in the illustrated embodiment is an SRAM 500. The SRAM 500 includes a first and second impedance matching circuit 503, 506 coupled to respective first and second impedance adjusters 508, 510 via respective first and second impedance-input terminals 512, 514. In the illustrated embodiment, the first and second impedance adjusters 508, 510 are variable resistors. As described in more detail below, the first impedance matching circuit 503 controls the output and access time of the SRAM 500, and the second impedance matching circuit 506 controls the "high- and low-impedance" time of the SRAM 500.

For clarity and ease of understanding, only the elements of the SRAM 500 useful in illustrating the present invention are described. Those skilled in the art will appreciate a control logic 520 of the SRAM 500 provides the necessary logic for accessing the SRAM 500. During a read access, an address is provided to the SRAM 500 on an address bus 530. The SRAM 500 includes a decoder 535 that decodes the address from the address bus 530 and provides the requested information from a data array 540 to an output register 550. Those skilled in the art will appreciate that the size of the address bus 530, as well as the data array 540, can vary from one implementation to another.

The information from the output register 550 is passed through a first delay circuit 554, which delays the requested information by a selected interval before providing it to an output buffer 565. It should be apparent that delaying the requested information by the selected interval likewise results in delaying the "access" time of the SRAM 500. The SRAM 500 of FIG. 5 implements the method of FIG. 2 to control the "access" time of the SRAM 500. At the block 200, the first impedance matching circuit 503 determines the impedance level present on the first impedance-input terminal 512. The impedance level of the first variable resistor 508 can be set by an end user. Based on the impedance level at the first impedance-input terminal 512, the first impedance matching circuit 503 provides a control signal to a control input of the first delay circuit 554. At the block 210, the first delay circuit 554 delays the "access" time of the SRAM 500 based on the impedance level determined by the first impedance matching circuit 503. Those skilled in the art will appreciate that although the above description illustrates delaying the "access" time of the SRAM 500 during a read access, the present invention is equally applicable for a write access.

The second impedance matching circuit 506 controls the "high- and low-impedance" times of the SRAM 500. The "high-impedance" time as used herein with reference to the illustrated embodiment refers to an interval during which the output buffers 565 are "off," and thus not driving. Conversely, the "low-impedance" time refers to an interval during which the output buffers 565 are "on," and thus driving either high or low.

The output buffers 565 include an enable-input terminal that controls the intervals during which the output buffers 565 are driving. The enable signal is generally provided by the control logic 520 of the SRAM 500 on line 570. In the illustrated embodiment, the enable signal on the line 570 is passed through a second delay circuit 574, which delays the enable signal on the line 570 by a selected interval before the enable signal reaches the enable-input terminal of the output buffers 565. Thus, the "high- and low-impedance" times can be controlled by the second impedance matching circuit 506 via the second delay circuit 574. The "hold" time of the SRAM 500 can likewise be controlled by ensuring that the output buffers 565 drive an output signal for a longer interval.

The SRAM 500 of FIG. 5 implements the method of FIG. 2 to control the "high- and low-impedance" times of the SRAM 500. At the block 200, the second impedance matching circuit 506 determines the impedance level present on the second impedance-input terminal 514. The impedance level of the second variable resistor 510 can be set by an end user. Based on the impedance level, the second impedance matching circuit 506 provides a control signal to a control input of the second delay circuit 574. At the block 210, the second delay circuit 574 delays the "high- or low-impedance times" of the SRAM 500 based on the impedance level determined by the second impedance matching circuit 506.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling the timing of a signal in a digital component having an impedance-input terminal, comprising:

determining an impedance level present at the impedance-input terminal by generating an output signal proportional to a voltage difference between the impedance-input terminal and a reference terminal having a preselected voltage;

controlling a channel device in response to the output signal until the voltage at the impedance terminal substantially equals the preselected voltage at the reference terminal; and delaying the timing of the signal in the digital component based on the impedance level.

2. The method of claim 1, wherein delaying the signal in the digital component includes delaying an access time of the digital component.

3. The method of claim 1, wherein delaying the signal in the digital component includes delaying an output time of the digital component.

4. The method of claim 1, wherein delaying the signal in the digital component includes delaying a hold time of the digital component.

5. The method of claim 1, wherein delaying the signal in the digital component includes delaying at least one of high-impedance time or low-impedance time of the digital component.

6. A digital component comprising:

an impedance-input terminal;

an impedance matching circuit adapted to determine an impedance level present at the impedance-input terminal the impedance matching circuit comprising:

a differential amplifier having an input terminal coupled to the impedance-input terminal, a reference terminal coupled to a voltage source, and an output terminal;

a control logic having an input terminal coupled to the output terminal of the differential amplifier, and an output terminal; and a load matching device having a first terminal coupled to the input terminal of the differential amplifier, and a second terminal coupled to the output terminal of the control logic, and an output terminal adapted to provide a control signal; and a delay circuit adapted to control a timing of a signal in the digital component based on the impedance level.

7. The digital component of claim 6, wherein the delay circuit comprises a delay cell adapted to provide a variable delay in response to the control signal from the load matching device.

8. The digital component of claim 7, wherein the delay cell comprises:

a delay element having an input terminal and an output terminal; and a multiplexer having a first and second input terminal, a control input terminal, and an output terminal, the first input terminal of the multiplexer coupled to the input terminal of the delay element and the second input terminal of the multiplexer coupled to the output terminal of the delay element, and the control input terminal adapted to receive the control signal.

9. The digital component of claim 8, wherein the load matching device comprises a plurality of pull-up load matching devices adapted to provide a plurality of control signals.

10. The digital component of claim 8, wherein the load matching device comprises a plurality of pull-down load matching devices adapted to provide a plurality of control signals.

11. The digital component of claim 9, wherein the delay circuit comprises a plurality of delay cells that are interconnected and adapted to provide a variable delay in response to the plurality of control signals from the plurality of pull-up load matching devices.

12. The digital component of claim 10, wherein the delay circuit comprises a plurality of delay cells that are interconnected and adapted to provide a variable delay in response to the plurality of control signals from the plurality of pull-down load matching devices.

13. An electrical component adapted to receive a first signal and delivering a second signal, comprising:

a delay circuit adapted to receive the first signal and deliver the second signal after a programmable delay responsive to receiving a control signal, the magnitude of the programmable delay being responsive to the magnitude of the control signal;

an impedance input terminal adapted to receive an impedance level signal; and an impedance matching circuit adapted to receive the impedance level signal and a reference signal and adapted to deliver the control signal to the delay circuit, the control signal having a magnitude responsive to a difference between the impedance level signal and the reference signal.

14. A digital component comprising:

an impedance-input terminal;

an impedance matching circuit adapted to determine an impedance level present at the impedance-input terminal; and a delay circuit adapted to control a timing of a signal in the digital component based on the impedance level, wherein the delay circuit comprises a delay cell adapted to provide a variable delay in response to a control signal.

15. The digital component of claim 14, wherein the delay cell comprises:

a delay element having an input terminal and an output terminal; and a multiplexer having a first and a second input terminal, a control input terminal, and an output terminal, the first input terminal of the multiplexer coupled to the input terminal of the delay element and the second input terminal of the multiplexer coupled to the output terminal of the delay element, and the control input terminal adapted to receive the control signal.

16. A method for delaying a signal, in a digital component having an impedance-input terminal, comprising:
   providing a reference level;
   controlling an impedance level at the impedance-input terminal;
   determining the impedance level present at the impedance-input terminal;
   generating a control signal in response to a difference between the impedance level and the reference level; and
   delaying the signal in the digital component in response to the control signal.

17. A method for delaying a signal in a digital component having an impedance-input terminal, comprising:
   providing a reference level;
   generating a control signal in response to a difference between the reference level and a level at the impedance-input terminal; and
   delaying the signal in the digital component in response to the control signal.

18. The method of claim 17, wherein the reference level is a reference voltage and wherein the level at the impedance-input terminal is a voltage at the impedance-input terminal.

19. The method of claim 18, further comprising controlling the voltage at the impedance-input terminal to be approximately equal to the reference voltage.

20. The method of claim 19, wherein controlling the voltage at the impedance-input terminal to be approximately equal to the reference voltage comprises controlling a channel device in response to the control signal to control the voltage at the impedance-input terminal to be approximately equal to the reference voltage.

21. The method of claim 17, wherein delaying the signal in the digital component includes delaying at least one of an access time, an output time, a hold time, a high-impedance time and a low-impedance time of the digital component.

22. A digital component, comprising:
   a reference node;
   an impedance node;
   a first circuit coupled to the reference node and coupled to the impedance node, the circuit adapted to generate a control signal in response to a difference in voltages at the reference node and the impedance node; and
   a delay circuit coupled to the first circuit, the delay circuit adapted to delay a signal in the digital component in response to the control signal.

23. The digital component of claim 22, wherein the delay circuit comprises a delay cell.

24. The digital component of claim 22, wherein the delay circuit comprises a delay cell adapted to provide a variable delay in response to the control signal.

25. The digital component of claim 24, wherein the delay cell comprises:
   a delay element having an input terminal and an output terminal; and
   a multiplexer having first and second input terminals, a control input terminal, and an output terminal, the first input terminal of the multiplexer coupled to the input terminal of the delay element, the second input terminal of the multiplexer coupled to the output terminal of the delay element, and the control input terminal adapted to receive the control signal.

26. The digital component of claim 22, wherein the first circuit comprises:
   a differential amplifier having a first input terminal coupled to the impedance node, a second input terminal coupled to the reference node, and an output terminal;
   a logic circuit having an input terminal coupled to the output terminal of the differential amplifier, and an output terminal; and
   a load matching circuit having a first terminal coupled to the impedance node, a second terminal coupled to the output terminal of the logic circuit, and an output terminal.

27. The digital component of claim 26, wherein the load matching circuit comprises a plurality of pull-up load matching devices adapted to provide a plurality of control signals.

28. The digital component of claim 26, therein the load matching circuit comprises a plurality of pull-down load matching devices adapted to provide a plurality of control signals.

29. The digital component of claim 27, wherein the delay circuit comprises a plurality of delay cells that are interconnected and adapted to provide a variable delay in response to the plurality of control signals from the plurality of pull-up load matching devices.

30. The digital component of claim 28, wherein the delay circuit comprises a plurality of delay cells that are interconnected and adapted to provide a variable delay in response to the plurality of control signals from the plurality of pull-down load matching devices.

* * * * *

UNITED STATES PATENT AND TRADEMARK OFFICE
CERTIFICATE OF CORRECTION

PATENT NO.    :   6,166,576
DATED         :   December 26, 2000
INVENTOR(S)   :   Eric J. Stave It is certified that error appears in the above-identified patent and that said Letters Patent is hereby corrected as shown below:

Column 10, line 34 (claim 28, line 1) - delete "therein" and insert therefor -- wherein --.

Signed and Sealed this

Fifteenth Day of May, 2001

*Attest:*

NICHOLAS P. GODICI

*Attesting Officer*    Acting Director of the United States Patent and Trademark Office